US010809566B2

(12) United States Patent
Zhong et al.

(10) Patent No.: US 10,809,566 B2
(45) Date of Patent: Oct. 20, 2020

(54) REFLECTOR AND METHOD FOR CONTROLLING THE SAME, BACKLIGHT MODULE, AND DISPLAY DEVICE

(71) Applicants: BOE Technology Group Co., Ltd., Beijing (CN); Chongqing BOE Display Lighting Co.. Ltd., Chongqing (CN)

(72) Inventors: Xihong Zhong, Beijing (CN); Wei Wang, Beijing (CN); Yong Yang, Beijing (CN)

(73) Assignees: BOE TECHNOLOGY GROUP CO., LTD., Beijing (CN); CHONGQING BOE DISPLAY LIGHTING CO., LTD., Chongqing (CN)

( * ) Notice: Subject to any disclaimer, the term of this patent is extended or adjusted under 35 U.S.C. 154(b) by 0 days.

(21) Appl. No.: 16/169,829

(22) Filed: Oct. 24, 2018

(65) Prior Publication Data
US 2019/0302532 A1 Oct. 3, 2019

(30) Foreign Application Priority Data

Mar. 30, 2018 (CN) .......................... 2018 1 0276496

(51) Int. Cl.
*G02F 1/13357* (2006.01)
*H01L 33/46* (2010.01)
(Continued)

(52) U.S. Cl.
CPC .. *G02F 1/133606* (2013.01); *G02F 1/133603* (2013.01); *G02F 1/133611* (2013.01);
(Continued)

(58) Field of Classification Search
CPC ........................... G02F 1/133606; G02F 1/153
See application file for complete search history.

(56) References Cited

U.S. PATENT DOCUMENTS 7,259,744 B2 * 8/2007 Arango ...................... B41J 2/01
345/107
7,626,753 B2 12/2009 Park et al.
(Continued)

FOREIGN PATENT DOCUMENTS

CN 102193291 A 9/2011
CN 103969874 A 8/2014
(Continued)

OTHER PUBLICATIONS

Office Action issued in corresponding Chinese Patent Application No. 201810276496.3, dated Aug. 4, 2020.

*Primary Examiner* — Farun Lu
(74) *Attorney, Agent, or Firm* — McDermott Will & Emery LLP (57) ABSTRACT

A reflector, and a method for controlling the same, a backlight module, and a display device are provided in the embodiments of the disclosure, the reflector including a first electrode layer and a second electrode layer opposite to and spaced apart from each other; the first electrode layer and the second electrode layer are configured to form a variable electrical field between the first electrode layer and the second electrode layer in response to electrical signals applied respectively on the first electrode layer and the second electrode layer; and light reflective particles and light absorptive particles are distributed in a space therebetween, the light reflective particles and the light absorptive particles being charged oppositely, the light reflective particles reflecting light rays while the light absorptive particles absorbing light rays, respectively.

15 Claims, 3 Drawing Sheets

(51) Int. Cl.
*H01L 33/50* (2010.01)
*H05B 45/46* (2020.01)
*G02F 1/153* (2006.01)
*G02F 1/155* (2006.01)

(52) U.S. Cl.
CPC .............. *G02F 1/153* (2013.01); *G02F 1/155* (2013.01); *H01L 33/46* (2013.01); *H01L 33/502* (2013.01); *H05B 45/46* (2020.01)

(56) References Cited

U.S. PATENT DOCUMENTS

| | | |
|---|---|---|
| 8,408,711 B2 | 4/2013 | Yang |
| 2004/0136048 A1* | 7/2004 | Arango .................... B41J 2/01 |
| | | 359/296 |
| 2005/0012707 A1 | 1/2005 | Liu |
| 2012/0280919 A1* | 11/2012 | Chu ........................ G06F 3/041 |
| | | 345/173 |
| 2015/0309365 A1 | 10/2015 | Wang |
| 2018/0122830 A1* | 5/2018 | Kachatryan .............. B32B 7/12 |

FOREIGN PATENT DOCUMENTS

| | | |
|---|---|---|
| CN | 104849912 A | 8/2015 |
| JP | 2008129599 A | 6/2008 |

\* cited by examiner

REFLECTOR AND METHOD FOR CONTROLLING THE SAME, BACKLIGHT MODULE, AND DISPLAY DEVICE

CROSS-REFERENCE TO RELATED INVENTION

The present disclosure claims the benefit of Chinese Patent Application Invention No. 201810276496.3 filed on Mar. 30, 2018 in the State Intellectual Property Office of China, the whole disclosure of which is incorporated herein by reference.

FIELD OF THE DISCLOSURE

Embodiments of the present disclosure relate to the technical field of display technologies, and especially to a reflector, and a method for controlling the same, a backlight module, and a display device.

BACKGROUND

At present, in a liquid crystal display device, ways for implementing a global regulation of light rays are mainly restricted to a regulation by adjusting a luminance of a light source, e.g., by controlling an illuminant luminance of a LED light source so as to adjust a luminance of a display screen. Then a local regulation of light rays may be implemented by controlling the illuminant luminance of the light source.

SUMMARY

The embodiments of the present disclosure have been made to overcome or alleviate at least one aspect of the above mentioned disadvantages and/or shortcomings in the prior art, by providing a reflector, and a method for controlling the same, a backlight module, and a display device.

Following technical solutions are adopted in exemplary embodiments of the invention for achieving the above desired technical purposes.

According to an aspect of the exemplary embodiment of the present disclosure, there is provided a reflector, comprising: a first electrode layer and a second electrode layer opposite to and spaced apart from each other; the first electrode layer and the second electrode layer are configured to form a variable electrical field therebetween in response to electrical signals applied respectively on the first electrode layer and the second electrode layer; and light reflective particles and light absorptive particles are distributed in a space between the first electrode layer and the second electrode layer, the light reflective particles and the light absorptive particles being charged oppositely, the light reflective particles reflecting light rays while the light absorptive particles absorbing light rays, respectively.

According to an embodiment of the disclosure, the first electrode layer comprises at least one first electrode and the second electrode layer comprises at least one second electrode.

According to an embodiment of the disclosure, the first electrode layer comprises a plurality of first electrodes arranged in an array.

According to an embodiment of the disclosure, each of the plurality of first electrodes is in a form of block shape.

According to an embodiment of the disclosure, the second electrode layer comprises a single second electrode which is a reference electrode in a form of an integral plate.

According to an embodiment of the disclosure, the second electrode layer comprises a plurality of second electrodes, each of which is a strip electrode arranged corresponding to a row or a column of the plurality of first electrodes.

According to an embodiment of the disclosure, the second electrode layer comprises a plurality of second electrodes arranged in an array, each of which is in a form of block shape, the plurality of second electrodes being arranged in one-to-one correspondence with the plurality of first electrodes.

According to an embodiment of the disclosure, the light reflective particles are positively charged and the light absorptive particles are negatively charged.

According to an embodiment of the disclosure, the light reflective particles are negatively charged and the light absorptive particles are positively charged.

According to an embodiment of the disclosure, the light reflective particles are magnesium hydroxide based silver nanoparticles.

According to an embodiment of the disclosure, the light absorptive particles are hydroxyl iron-carbon composite particles.

According to an embodiment of the disclosure, both the first electrode layer and the second electrode layer are transparent.

According to an embodiment of the disclosure, a first protective film layer is provided on a side of the first electrode layer facing away from the second electrode layer, and a second protective film layer is provided on a side of the second electrode layer facing away from the first electrode layer.

According to an embodiment of the disclosure, both the first protective film layer and the second protective film layer are formed by polyethylene terephthalate.

According to another aspect of the exemplary embodiment of the present disclosure, there is provided a method for controlling the reflector as above, comprising: forming the electrical field between the first electrode layer and the second electrode layer, by inputting electrical signals into the first electrode layer and the second electrode layer, respectively; and moving the light reflective particles and the light absorptive particles in opposite directions through the action of the electrical field and in turn regulating the reflectivity of the reflector, by adjusting the electrical field by regulating the electrical signals.

According to an embodiment of the disclosure, the step of moving the light reflective particles and the light absorptive particles in opposite directions through the action of the electrical field and in turn regulating the reflectivity of the reflector, by adjusting the electrical field by regulating the electrical signals comprises one of the following: moving the light reflective particles towards a side of the reflector at a light incidence surface thereof and the light absorptive particles towards an opposed side of the reflector opposite to the light incidence surface thereof and in turn increasing the reflectivity of the reflector, by adjusting the electrical field by regulating the electrical signals; and moving the light absorptive particles towards the side of the reflector at the light incidence surface thereof and the light reflective particles towards the opposed side of the reflector opposite to the light incidence surface thereof and in turn decreasing the reflectivity of the reflector, by adjusting the electrical field by regulating the electrical signals.

According to still another aspect of the exemplary embodiment of the present disclosure, there is provided a backlight module, comprising: the reflector as above; and a backlight source configured to provide an incident light towards the reflector.

According to yet another aspect of the exemplary embodiment of the present disclosure, there is provided a display panel, comprising: the backlight module as above; and a housing configured to accommodate the backlight module.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF EMBODIMENTS OF THE DISCLOSURE

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings re only intended to exemplarily illustrate the contents of the disclosure, rather than to demonstrate the practical dimension or proportion of components of a reflector, a backlight module, and a display device.

Figure 1:
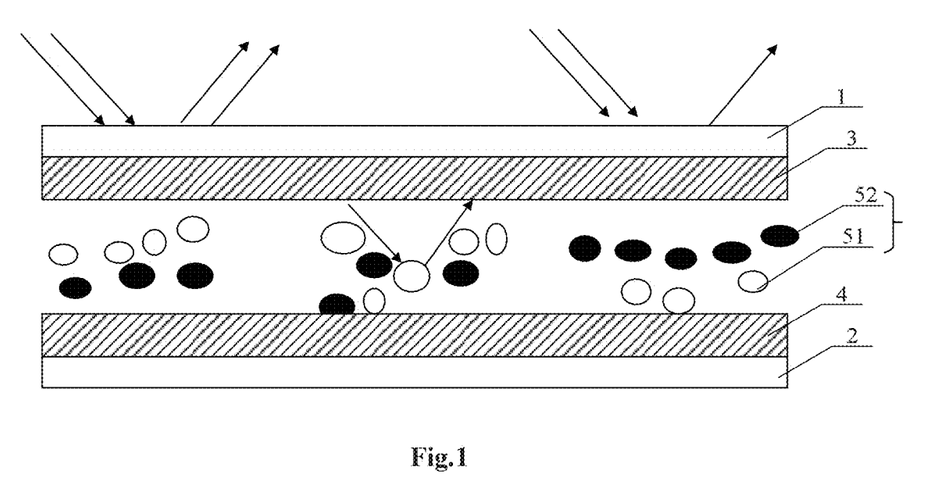
FIG. 1 illustrates a schematic structural view of a reflector according to an embodiment of the disclosure.

According to a general technical concept of embodiments of the present disclosure, in an aspect thereof, as illustrated in FIG. 1, a reflector is provided, comprising a first electrode layer 3 and a second electrode layer 4 provided opposite to and spaced apart from each other, the reflector being configured to form a variable electrical field between the first electrode layer 3 and the second electrode layer 4. A space between the first electrode layer 3 and the second electrode layer 4 functions as a particle layer 5, in which light reflective particles 51 and light absorptive particles 52 are distributed, the light reflective particles 51 reflecting light rays being incident thereon, and the light absorptive particles 52 absorbing light rays incident thereon, respectively; and the light reflective particles 51 and the light absorptive particles 52 are oppositely charged, and thus for example move in two opposite directions respectively through an action of a same external electrical field (e.g., the variable electrical field as above), respectively.

As illustrated in FIG. 1, by way of example, an a light incidence surface of the reflector is a surface of the first electrode layer 3 facing away from the second electrode layer 4 (i.e., an upper surface of the first electrode layer 3 as illustrated). In a condition that it is desired to enhance a reflectivity of the reflector, then electrical signals applied on the first electrode layer 3 and the second electrode layer 4 are regulated so as to control the electrical field created therebetween, such that the light reflective particles 51 move towards a side of reflector adjacent to the first electrode layer 3 and the light absorptive particles 52 move towards another side of the reflector adjacent to the second electrode layer 4 through the action of the electrical field; and in such a condition, when a light is incident onto the reflector through the light incidence surface, the light reflective particles 51 aggregating within the particle layer 5 on a side of the reflector adjacent to the light incidence surface thereof may reflect light rays so as to increase the reflectivity of the reflector. On the contrary, in a condition that it is desired to decrease the reflectivity of the reflector, then electrical signals applied on the first electrode layer 3 and the second electrode layer 4 are also regulated so as to control the electrical field created therebetween, such that the light absorptive particles 52 move towards the side of reflector adjacent to the first electrode layer 3 and the light reflective particles 51 move towards another side of the reflector adjacent to the second electrode layer 4 through the action of the electrical field; and in such a condition, when a light is incident onto the reflector through the light incidence surface, the light absorptive particles 52 aggregating within the particle layer 5 on a side of the reflector adjacent to the light incidence surface thereof may absorb light rays so as to decrease the reflectivity of the reflector. By way of example, based on practical requirements, the electrical signals applied on both the first electrode layer 3 and the second electrode layer 4 are regulated, so as to control magnitude and/or direction of the electrical field created therebetween, and thus to change moving directions, aggregating positions and aggregating amounts of the light reflective particles 51 and the light absorptive particles 52 respectively, and in turn to change the reflectivity of the reflector.

The reflector according to the embodiment of the disclosure comprises a first electrode layer 3 and a second electrode layer 4 provided opposite to and spaced apart from each other, the reflector being configured to form a variable electrical field between the first electrode layer 3 and the second electrode layer 4. A space between the first electrode layer 3 and the second electrode layer 4 functions as a particle layer 5, in which light reflective particles 51 and light absorptive particles 52 are distributed, the light reflective particles 51 reflecting light rays being incident thereon, and the light absorptive particles 52 absorbing light rays incident thereon, respectively; and the light reflective particles 51 and the light absorptive particles 52 are oppositely charged. As such, by loading and applying electrical signals on the first electrode layer 3 and the second electrode layer 4, respectively, the variable electrical field is created therebetween which may control movements of the light reflective particles 51 and the light absorptive particles 52 and in turn control the reflectivity of the reflector. Therefore, an application of the reflector onto a backlight module of a liquid crystal display device facilitates a regulation of a luminance of a display screen by the reflector so as to implement a global light regulation of the liquid crystal display device.

By way of example, light reflective particles 51 which are positively charged and light absorptive particles 52 which are negatively charged are taken as an example and illustrated in detail hereinafter.

As illustrated in FIG. 1, the reflector further comprises: a first protective film layer 1 provided on a side of the first electrode layer 3 facing away from the second electrode layer 4, and a second protective film layer 2 provided on a side of the second electrode layer 4 facing away from the first electrode layer 3. The light reflective particles 51 are for example magnesium hydroxide based silver nanoparticles, which are compounded by magnesium hydroxide which functions as an electropolar material and silver nanoparticles which have an effect of reflecting light; and due to the existence of the compounded magnesium hydroxide which functions as an electropolar material, surfaces of the magnesium hydroxide based silver nanoparticles are positively charged such that once they are located in an electrical field, they may move in a direction of the electrical field. And the light absorptive particles 52 are for example hydroxyl iron-carbon composite particles, in which compounded carbon particles have an effect of absorbing light while compounded hydroxyl particle groups are negatively charged such that once the hydroxyl iron-carbon composite particles are located in an electrical field, they may move in another direction opposite to the direction of the electrical field.

In the embodiment of the disclosure, by way of example, the light incidence surface of the reflector is a surface of the first protective film layer 1 facing away from the second protective film layer 2, then the first electrode layer 3 is provided proximate to (i.e., adjacent to) the light incidence surface while the second electrode layer 4 is provided distal to (i.e., away from) the light incidence surface. If it is desired to increase the reflectivity of the reflector, it is only required to change the electrical signals applied on the first electrode layer 3 and the second electrode layer 4 such that a voltage of the first electrode layer 3 is smaller than a voltage of the second electrode layer 4, and a direction of the electrical field is a direction pointing to the first electrode layer 3 from the second electrode layer 4. As such, the magnesium hydroxide based silver nanoparticles which are positively charged may aggregate in the direction of the electrical field within the particle layer 5 towards the side of reflector adjacent to light incidence surface thereof, and the hydroxyl iron-carbon composite particles which are negatively charged may aggregate in the another direction opposite to the direction of the electrical field within the particle layer 5 towards an opposed side of the reflector away from the light incidence surface thereof; once light rays are incident on the reflector, they are reflected by the magnesium hydroxide based silver nanoparticles, so as to increase the reflectivity of the reflector. If it is desired to increase the reflectivity of the reflector, it is only required to change the electrical signals applied on the first electrode layer 3 and the second electrode layer 4 such that the voltage of the first electrode layer 3 is larger than the voltage of the second electrode layer 4, and the direction of the electrical field is a direction pointing to the second electrode layer 4 from the first electrode layer 3. As such, the hydroxyl iron-carbon composite particles which are negatively charged may aggregate in the another direction opposite to the direction of the electrical field within the particle layer 5 towards the side of reflector adjacent to light incidence surface thereof, and the magnesium hydroxide based silver nanoparticles which are positively charged may aggregate in the direction of the electrical field within the particle layer 5 towards the opposed side of the reflector away from the light incidence surface thereof; once light rays are incident on the reflector, they are absorbed by the hydroxyl iron-carbon composite particles, so as to decrease the reflectivity of the reflector. In other words, the electrical signals applied on both the first electrode layer 3 and the second electrode layer 4 are regulated, so as to control magnitude and/or direction of the electrical field created therebetween, and thus to change moving directions, aggregating positions of the light reflective particles 51 and the light absorptive particles 52 respectively, and in turn to change the reflectivity of the reflector.

Figure 2:
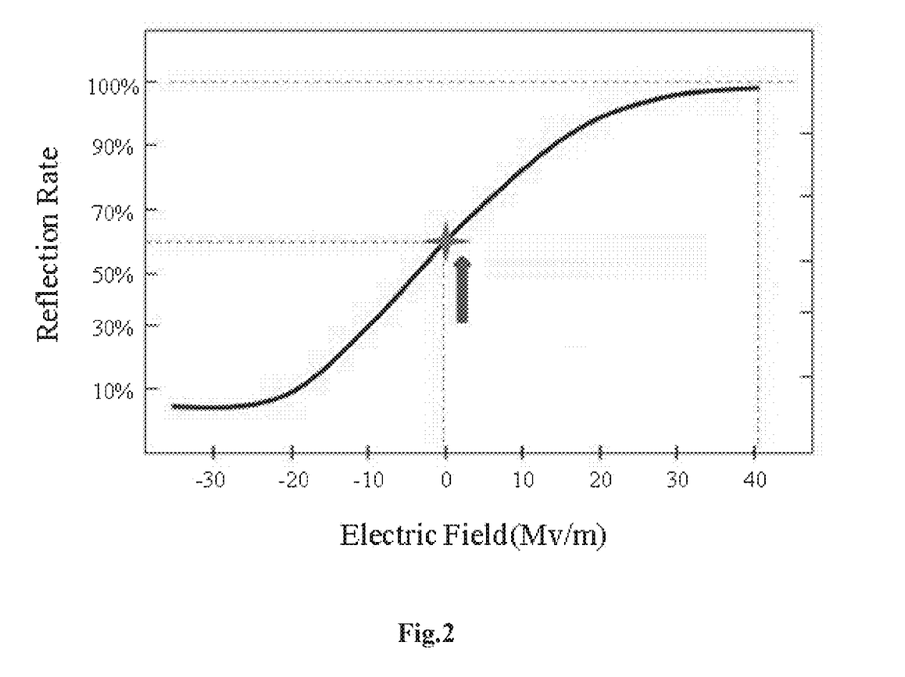
FIG. 2 illustrates a plot of relationship between a reflectivity of a reflector and an electric field intensity according to an embodiment of the disclosure.

Furthermore, e.g., by regulating an intensity of the electrical field, the aggregating amounts of the light reflective particles 51 and the light absorptive particles 52 at different locations within the particle layer 5, the reflectivity of the reflector may be further regulated. As illustrated in FIG. 2, it illustrates a plot of relationship between the Reflection Rate (i.e., measure of reflectivity) of the reflector and the intensity of the electrical field according to an embodiment of the disclosure. By way of example, it is specified that the direction pointing to the first electrode layer 3 from the second electrode layer 4 as illustrated in FIG. 1 is a forward direction of the electrical field; and as illustrated in FIG. 2, in a condition that there is no electrical potential difference between these two electrode layers, i.e., the intensity of the electrical field therebetween is zero, then the reflection rate of the reflector itself is approximately 60%, in which condition the light reflective particles 51 and the light absorptive particles 52 are distributed at random between these two electrode layers (i.e., each type of the particles follows a free distribution, without any restrictions applied thereon). With a gradual forward increase of the intensity of the electrical field from zero, the light reflective particles 51 gradually aggregate in the direction of the electrical field within the particle layer 5 towards the side of reflector adjacent to light incidence surface thereof, and the light absorptive particles 52 gradually aggregate in the another direction opposite to the direction of the electrical field within the particle layer 5 towards the opposed side of the reflector away from the light incidence surface thereof; such that there may be an approximate linear growth relationship between the reflection rate of the reflector and the intensity of the electrical field; and once the intensity of the electrical field reaches 40 Mv/m, the reflection rate of the reflector approaches an upper limit value thereof, i.e., approximately 100%. In other words, in such a condition, with the increase in the intensity of the electrical field, the aggregating amount of the light reflective particles towards the side of reflector adjacent to light incidence surface thereof may gradually increase, such that the reflection rate of the reflector also increases gradually. Similarly, with a reverse increase in the intensity of the electrical field, the aggregating amount of the light absorptive particles towards the side of reflector adjacent to light incidence surface thereof may gradually increase, such that the reflection rate of the reflector decreases gradually; and once the intensity of the electrical field reaches 30 Mv/m, the reflection rate of the reflector decreases to less than 10%. In other words, the electrical signals applied on both the first electrode layer 3 and the second electrode layer 4 are regulated, so as to control magnitude and/or direction of the electrical field created therebetween, and thus to change moving directions, aggregating positions of the light reflective particles 51 and the light absorptive particles 52 respectively, and in turn to change aggregating amounts of the light reflective particles 51 and the light absorptive particles 52 at respective aggregating positions respectively, such that the reflectivity of the reflector may be changed.

As above, e.g., by adjusting the intensity of the electrical field created between the first electrode layer 3 and the second electrode layer 4, an accurate regulation of the reflectivity of the reflector may be implemented effectively.

It may be understood that, aforementioned light reflective particles which are positively charged may not be limited to magnesium hydroxide based silver nanoparticles, and may for example be any other particles which are positively charged and have an effect of reflecting light. And aforementioned light absorptive particles which are negatively charged may not be limited to hydroxyl iron-carbon composite particles, and may for example be any other particles which are negatively charged and have an effect of absorbing light. As to specific types of the light reflective particles and light absorptive particles, there is no limitation thereon in embodiments of the disclosure.

In above embodiments, light reflective particles 51 which are positively charged and light absorptive particles 52 which are negatively charged are taken as an example and illustrated in detail. It may be understood that, in a condition that the light reflective particles 51 are negatively charged and the light absorptive particles 52 are positively charged, the reflectivity of the reflector may also be adjusted by an regulation of the electrical field, with a specific regulating process similar to that mentioned in the above embodiments, without repeating herein any more.

Figure 3:
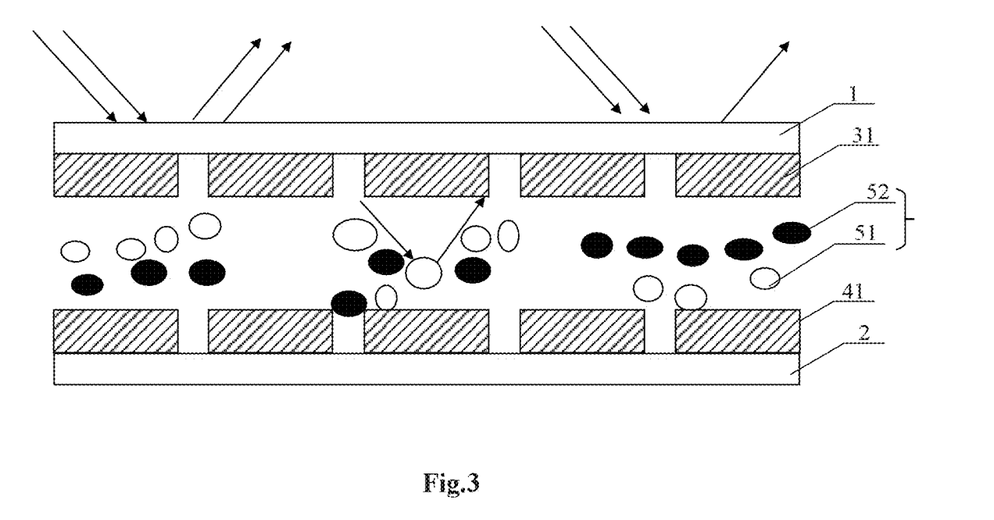
FIG. 3 illustrates a schematic structural view of another reflector according to an embodiment of the disclosure.

Moreover, as illustrated in FIG. 3, the first electrode layer 3 comprises at least one first electrode 31, and the second electrode layer 4 comprises at least one second electrode 41, each first electrode 31 may for example be in a form of block shape as illustrated, and each second electrode 41 may also for example be in a form of block shape, too. It may be understood that, one or more variable electrical fields may be formed between the first electrode layer 3 and the second electrode layer 4, so as to control respective movements of the light reflective particles 51 and the light absorptive particles 52, and in turn to regulate the reflection rate of the reflector. In a condition that the first electrode layer 3 comprises a plurality of first electrode 31 arranged in an array, and the second electrode layer 4 comprises at least one second electrode 41, a plurality of electrical fields may for example be formed between the first electrode layer 3 and the second electrode layer 4; and by controlling these electrical fields individually, respective movements of the light reflective particles 51 and the light absorptive particles 52 within the electrical fields may be controlled, so as to regulate the reflection rates of various regions of the reflector corresponding to these electrical fields, such that a zoning regulation of the reflection rate of the reflector may be implemented.

Specifically, the first electrode layer 3 comprises a plurality of first electrodes 31 arranged in an array, each of which is for example in the form of block shape, and the plurality of first electrodes 31 are arranged in several rows and in several columns. And the at least one second electrode 41 is merely for example a single second electrode which is in a form of an integral slice or plate; in other words, the second layer electrode layer 4 comprises a reference electrode in a form of an integral slice or plate, and variable electrical field(s) may for example be formed between respective first electrodes 31 and the reference electrode. By regulating the electrical signals applied on respective first electrodes 31 while remaining an electrical signal applied on the reference electrode unchanged (certainly, such electrical signal itself may be alterable simultaneously), the electrical field(s) between the respective first electrodes and the reference electrode may be regulated, such that the light reflective particles 51 and the light absorptive particles 52 within the electrical field(s) may be moved in two opposite directions, and thus a zoning (i.e., segmented) regulation of the reflection rate of the reflector may in turn be implemented.

Each second electrode 41 may also for example be a strip electrode, i.e., the second electrode layer 4 comprises a plurality of strip electrodes corresponding to the plurality of first electrodes 31 respectively; specifically, each of the plurality of strip electrodes is for example arranged to be corresponding to a row or a column of the plurality of first electrodes 31, e.g., at least aligned with each other partially; and variable electrical fields may be formed respectively, each being created between each of the plurality of first electrodes 31 and a corresponding one of the plurality of strip electrodes. By regulating the electrical signals applied respectively on the plurality of first electrodes 31 and/or the plurality of strip electrodes, the electrical fields between the respective first electrodes 31 and the strip electrodes may be regulated, such that the light reflective particles 51 and the light absorptive particles 52 within the respective electrical fields may be moved in two opposite directions, and thus a zoning (i.e., segmented) regulation of the reflection rate of the reflector may in turn be implemented.

Each second electrode 41 may also for example be a block electrode, i.e., the second electrode layer 4 has a structure similar to that of the first electrode layer 3, i.e., comprising a plurality of electrodes arranged in an array each of which is in the form of block shape, the plurality of second electrodes each in the form of block shape being arranged in one-to-tone correspondence with the plurality of first electrodes, e.g., at least aligned with each other partially; and variable electrical fields may be formed respectively, each being created between each of the plurality of first electrodes 31 and a corresponding one of the plurality of second electrodes in one-to-one correspondence. By regulating the electrical signals applied respectively on the plurality of first electrodes 31 and/or the plurality of second electrodes each in the form of block shape, respectively, the electrical fields between the respective first electrodes 31 and the second electrodes 41 each in the form of block shape in one-to-one correspondence with each other may be regulated, such that the light reflective particles 51 and the light absorptive particles 52 within the respective electrical fields may be moved in two opposite directions, and thus a zoning (i.e., segmented) regulation of the reflection rate of the reflector may in turn be implemented.

Specifically, in a condition that it is required that the reflection rate at a certain region of the reflector is to be increased locally, it is only necessary to regulate the electrical signals applied on the first electrode(s) 31 and/or the second electrode(s) 41 corresponding to each other within the region of the reflector so as to change the electrical field within the region, such that the light reflective particles 51 move towards a side of the region adjacent to light incidence surface, and thus the reflection rate at the region of the reflector is increased locally; and in a condition that it is required that the reflection rate at a certain region of the reflector is to be decreased locally, it is only necessary to regulate the electrical signals applied on the first electrode(s) 31 and/or the second electrode(s) 41 corresponding to each other within the region so as to change the electrical field within the region, such that the light absorptive particles 52 move towards the side of the region adjacent to light incidence surface, and thus the reflection rate at the region of the reflector is decreased locally. Furthermore, e.g., by regulating the intensity of the electrical field corresponding to the region, the aggregating amounts of the light reflective particles 51 and the light absorptive particles 52 at different positions within the region may be controlled respectively, such that the reflectivity within the region may be further regulated.

As above, the electrical fields formed between the plurality of first electrodes 31 and the second electrode(s) 41 may be controlled individually and separately, without any interference thereamong; as such, the reflection rate at various regions of the reflector may be controlled hereby, such that there may be an even more uniform and smooth bright-dark transition of a liquid crystal display screen.

Figure 4:
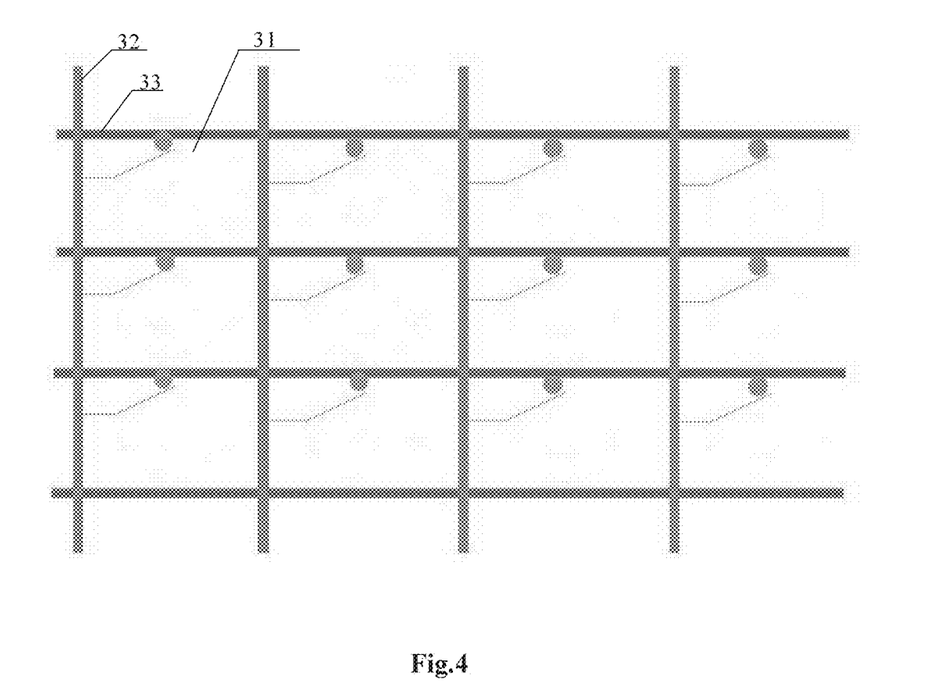
FIG. 4 illustrates a schematic local structure top view of a first electrode layer according to an embodiment of the disclosure.

Specifically, in a condition that the first electrode layer 3 comprises a plurality of first electrodes 31 arranged in an array, a control on the plurality of first electrodes 31 of the first electrode layer 3 may for example be implemented by a circuit structure as follows. As illustrated in FIG. 4, it illustrates a schematic local structure top view of a first electrode layer according to an embodiment of the disclosure. In a condition that the second electrode layer 4 also comprises a plurality of second electrodes 41 arranged in an array, the second electrode layer 4 has a structure which is for example similar to that of the first electrode layer 3. Therefore, only the structure of the first electrode layer 3 is taken as an example hereinafter. As illustrated in FIG. 4, the first electrode layer 3 comprises a plurality of first electrodes 31 each of which is provided to be corresponding to a longitudinal line (i.e., vertical line as illustrated) 32 and a transverse line (i.e., horizontal line as illustrated) 33, each of the plurality of first electrodes 31 comprises a control switch which comprises a control terminal, a signal input terminal and a signal output terminal, the control terminal of the control switch being connected with the longitudinal line 32, the signal input terminal of the control switch being connected with the transverse line 33, and the signal output terminal being connected with the first electrode 31. With such a circuit structure of the first electrode layer 3, a control on charge and discharge of each of the plurality of first electrodes 31 may be implemented. By way of example, in a condition that it is expected that the reflection rate at a certain region of the reflector is to be regulated locally, it is required to regulate the electrical signals applied on the first electrode(s) 31 and/or the second electrode(s) 41 corresponding to the region of the reflector, specifically for example by loading an electrical signal instructing to turn on the control switch onto the longitudinal line(s) 32 and by loading another electrical signal onto the transverse line(s) 33 instructing to charge the first electrode(s) 31 and/or the second electrode(s) 41, so as to change the electrical field created between the first electrode(s) 31 and the second electrode(s) 41 corresponding to the region, such that respective movements of the light reflective particles and the light absorptive particles are controlled and the reflection rate of the reflector at the region may in turn be regulated.

Furthermore, each first electrode and each second electrode may be connected to respective individual signal lines, respectively, to implement a control on charge and discharge of the first electrode and the second electrode. Thereby, in a condition that it is required to regulate the reflection rate of the reflector at a certain region, by changing the electrical signals loaded onto the signal lines for the first electrode(s) and/or the second electrode(s) corresponding to the region, the first electrode(s) and/or the second electrode(s) are discharged, so as to change the electrical field(s) formed between the first electrode(s) and the second electrode(s) corresponding to the region, and thus to control respective movements of the light reflective particles and the light absorptive particles and in turn to regulate the reflection rate of the reflector at the region.

In addition, in a condition that the second electrode is an electrode in a form of a plate, i.e., the second electrode layer comprises a second electrode which is a reference electrode in a form of an integral plate, for example, a constant voltage may be loaded onto the reference electrode, with a controlling way of the first electrode layer according to any one as above, e.g., by loading desired voltages onto the plurality of first electrodes of the first electrode layer individually. For example, the electrical signals applied onto the plurality of first electrodes 31 are adjusted respectively, and the electrical signal applied onto the reference electrode remains unchanged (certainly, such electrical signal itself may be alterable simultaneously), the electrical fields between the respective first electrodes 31 and the reference electrode in the form of an integral plate may be regulated, so as to control respective movements of the light reflective particles and the light absorptive particles and in turn to regulate the reflection rate of the reflector at the region. In a condition that each second electrode is a strip electrode, i.e., the second electrode layer comprises a plurality of strip electrodes corresponding to the plurality of first electrodes respectively; specifically, each of the plurality of strip electrodes is for example arranged to be corresponding to a row or a column of the plurality of first electrodes 31, e.g., at least aligned with each other partially; and each first electrode and each second electrode may be connected to respective individual signal lines, respectively, to implement a control on charge and discharge of the first electrode and the second electrode, e.g., with a controlling way of the first electrode layer according to any one as above. For example, the electrical signals applied onto the plurality of first electrodes 31 and the corresponding strip electrode(s) are adjusted respectively, the electrical fields between the respective first electrodes 31 and the strip electrode(s) in the form of an integral plate may be regulated, so as to control respective movements of the light reflective particles and the light absorptive particles and in turn to regulate the reflection rate of the reflector at the region.

Above embodiments are merely exemplary, without any limitation on specific structure and controlling way of the first electrode layer and the second electrode layer in the embodiments of the disclosure.

As above, a plurality of variable electrical fields are formed between the first electrode layer 3 and the second electrode layer 4, and are individually controlled without any interference thereamong, so as to control the reflection rate of the reflector at various regions thereof and to implement a local regulation of the reflection rate of the reflector everywhere, and in turn to implement a global regulation of the reflection rate of the reflector as a whole. The more regions which are adjustable exist in the reflector, the more uniform and smooth a bright-dark transition of the liquid crystal display screen is, by controlling the reflection rate of the reflector at various regions thereof.

It may be understood that, the more quantities of the first electrodes are divided within the first electrode layer, the more quantities of the adjustable/regulatable regions corresponding thereto are provided in the reflector, and in turn the more accurate the regulation of the reflection rate of the reflector may be. In consideration of processes, it may be relatively simple to divide the first electrodes as rectangleshaped electrodes, however, without limitations on their respective shapes and quantities in the embodiments of the disclosure; in other words, the first electrodes may be divided depending on practical requirements.

The first electrode layer 3 and the second electrode layer 4 are both transparent electrode layers in above embodiments, the first electrodes and the second electrode(s) may for example be formed by ITO material which may enhance the light transmittance. Similarly, the first protective film layer 1 and the second protective film layer 2 may also be formed by a transparent material, e.g., polyethylene terephthalate. It is typically required that the light incidence surface of the reflector is smooth and transparent and has a relatively strong scrape resistance so as to ensure an effective incidence of light and to prevent a surface injury thereof and any adverse effect on reflection efficiency of light.

Figure 5:
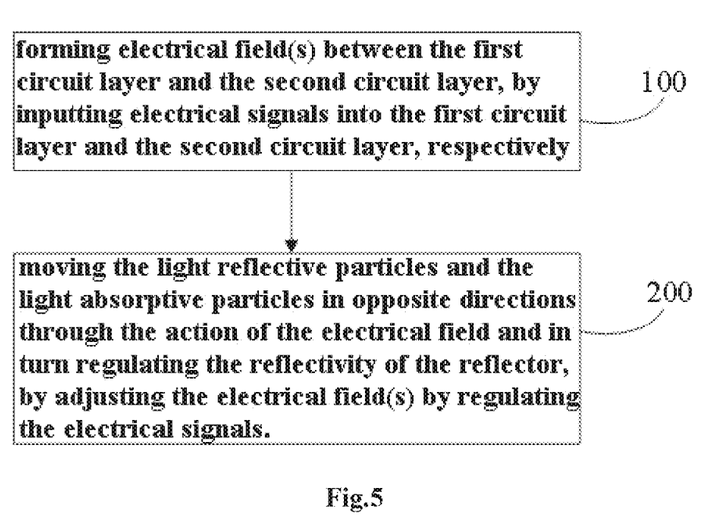
FIG. 5 illustrates a flow chart of a method for controlling the reflector according to an embodiment of the disclosure.

In another aspect of the embodiments of the disclosure, a method for controlling the reflector as above is further provided. As illustrated in FIG. 5, the method comprises:

Step 100, forming the electrical field between the first electrode layer and the second electrode layer, by inputting electrical signals into the first electrode layer and the second electrode layer, respectively; and Step 200, moving the light reflective particles and the light absorptive particles in opposite directions through the action of the electrical field and in turn regulating the reflectivity of the reflector, by adjusting the electrical field by regulating the electrical signals.

The step 200 particularly comprises either one of the following steps: moving the light reflective particles towards a side of the reflector at a light incidence surface thereof and the light absorptive particles towards an opposed side of the reflector opposite to the light incidence surface thereof and in turn increasing the reflectivity of the reflector, by adjusting the electrical field by regulating the electrical signals; and moving the light absorptive particles towards the side of the reflector at the light incidence surface thereof and the light reflective particles towards the opposed side of the reflector opposite to the light incidence surface thereof and in turn decreasing the reflectivity of the reflector, by adjusting the electrical field by regulating the electrical signals As such, the electrical signals applied on both the first electrode layer 3 and the second electrode layer 4 are regulated, so as to control magnitude (i.e., intensity) and/or direction of the electrical field created therebetween, so as to move the light reflective particles and the light absorptive particles respectively in two opposite directions through the action of the electrical field, such that the aggregating amounts of the light reflective particles and the light absorptive particles at different locations may be changed respectively by regulating the intensity of the electrical field, and the reflection rate of the reflector may in turn be regulated. Specific processes of the regulation are set forth in detail in above embodiments, without repeating herein any more.

In still another aspect of the embodiments of the disclosure, a backlight module is further provided, comprising: the reflector as above; and a backlight source configured to provide an incident light towards the reflector. The reflector is applied into the backlight module, implementing both local and global regulation of the reflection rate of the reflector in the backlight module, such that the regulation of the light of the liquid crystal display device may not be restricted to the regulation of the luminance of the light source.

In yet another aspect of the embodiments of the disclosure, a display device is further provided, comprising: the backlight module as above, and a housing which is configured to accommodate the backlight module. The display device may be any product or component having a display functionality such as mobilephone, tablet computer, television set, display, laptop computer, digital photo frame, navigator, electronic paper and the like. The display device comprises the backlight module as described in above embodiment, which may regulate the luminance of the display screen effectively such that there may be an even more uniform and smooth bright-dark transition of the display screen.

There are several advantageous technical effects brought about by the technical solutions as provided in embodiments of the disclosure, as below:

The reflector in the embodiments of the disclosure comprises a first electrode layer and a second electrode layer opposite to and spaced apart from each other, and the first electrode layer and the second electrode layer are configured to form a variable electrical field between the first electrode layer and the second electrode layer in response to electrical signals applied respectively on the first electrode layer and the second electrode layer; and light reflective particles and light absorptive particles are distributed in a space between the first electrode layer and the second electrode layer, the light reflective particles and the light absorptive particles being charged oppositely, the light reflective particles reflecting light rays while the light absorptive particles absorbing light rays, respectively. As such, by loading and applying electrical signals on the first electrode layer and the second electrode layer, the variable electrical field is created therebetween which may control movements of the light reflective particles and the light absorptive particles and in turn control the reflectivity of the reflector. Therefore, an application of the reflector onto a backlight module of a liquid crystal display device facilitates a regulation of a luminance of a display screen by the reflector so as to implement a global light regulation of the liquid crystal display device.

Various embodiments of the present disclosure have been illustrated progressively, the same or similar parts of which can be referred to each other or one another. The differences among these various embodiments are described in emphasis.

The transfer template, the display substrate, the display panel and the method for manufacturing the same are illustrated in detail as above in embodiments of the disclosure, by using specific exemplary embodiments to set forth principles and implementations thereof, only intending to assist in understanding the methods and core concept thereof in embodiments of the disclosure.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A reflector, comprising:
a first electrode layer and a second electrode layer opposite to and spaced apart from each other,
wherein the first electrode layer and the second electrode layer are configured to form a variable electrical field therebetween in response to electrical signals applied respectively on the first electrode layer and the second electrode layer; and
light reflective particles and light absorptive particles are distributed in a space between the first electrode layer and the second electrode layer, the light reflective particles and the light absorptive particles being charged oppositely, the light reflective particles reflecting light rays while the light absorptive particles absorbing light rays, respectively,
wherein the light reflective particles are positively charged and the light absorptive particles are negatively charged, and
wherein the light reflective particles are magnesium hydroxide based silver nanoparticles.

2. The reflector according to claim 1, wherein the first electrode layer comprises at least one first electrode and the second electrode layer comprises at least one second electrode.

3. The reflector according to claim 2, wherein the first electrode layer comprises a plurality of first electrodes arranged in an array.

4. The reflector according to claim 3, wherein each of the plurality of first electrodes is in a form of block shape.

5. The reflector according to claim 3, wherein the second electrode layer comprises a single second electrode which is a reference electrode in a form of an integral plate.

6. The reflector according to claim 3, wherein the second electrode layer comprises a plurality of second electrodes, each of which is a strip electrode arranged corresponding to a row or a column of the plurality of first electrodes.

7. The reflector according to claim 3, wherein the second electrode layer comprises a plurality of second electrodes arranged in an array, each of which is in a form of block shape, the plurality of second electrodes being arranged in one-to-one correspondence with the plurality of first electrodes.

8. The reflector according to claim 1, wherein the light absorptive particles are hydroxyl iron-carbon composite particles.

9. The reflector according to claim 1, wherein both the first electrode layer and the second electrode layer are transparent.

10. The reflector according to claim 1, wherein a first protective film layer is provided on a side of the first electrode layer facing away from the second electrode layer, and a second protective film layer is provided on a side of the second electrode layer facing away from the first electrode layer.

11. The reflector according to claim 10, wherein both the first protective film layer and the second protective film layer are formed by polyethylene terephthalate.

12. A method for controlling a reflector, wherein the reflector comprises a first electrode layer and a second electrode layer opposite to and spaced apart from each other,
wherein the first electrode layer and the second electrode layer are configured to form a variable electrical field therebetween in response to electrical signals applied respectively on the first electrode layer and the second electrode layer; and
light reflective particles and light absorptive particles are distributed in a space between the first electrode layer and the second electrode layer, the light reflective particles and the light absorptive particles being charged oppositely, the light reflective particles reflecting light rays while the light absorptive particles absorbing light rays, respectively, comprising:
forming the electrical field between the first electrode layer and the second electrode layer, by inputting electrical signals into the first electrode layer and the second electrode layer, respectively; and
moving the light reflective particles and the light absorptive particles in opposite directions through the action of the electrical field and in turn regulating the reflectivity of the reflector, by adjusting the electrical field by regulating the electrical signals;
wherein the light reflective particles are positively charged and the light absorptive particles are negatively charged, and wherein the light reflective particles are magnesium hydroxide based silver nanoparticles.

13. The method according to claim 12, wherein the step of moving the light reflective particles and the light absorptive particles in opposite directions through the action of the electrical field and in turn regulating the reflectivity of the reflector, by adjusting the electrical field by regulating the electrical signals comprises one of the following:
moving the light reflective particles towards a side of the reflector at a light incidence surface thereof and the light absorptive particles towards an opposed side of the reflector opposite to the light incidence surface thereof and in turn increasing the reflectivity of the reflector, by adjusting the electrical field by regulating the electrical signals; and
moving the light absorptive particles towards the side of the reflector at the light incidence surface thereof and the light reflective particles towards the opposed side of the reflector opposite to the light incidence surface thereof and in turn decreasing the reflectivity of the reflector, by adjusting the electrical field by regulating the electrical signals.

14. A backlight module, comprising:
the reflector according to claim 1; and
a backlight source configured to provide an incident light towards the reflector.

15. A display panel, comprising:
the backlight module according to claim 14; and
a housing configured to accommodate the backlight module.

* * * * *